US010761114B2

(12) United States Patent
Zhang et al.

(10) Patent No.: US 10,761,114 B2
(45) Date of Patent: Sep. 1, 2020

(54) MAIN FEED THRU UNIT CONFIGURED AS A SERVICE EQUIPMENT OR A MAIN SERVICE DISCONNECT FOR MODULAR METERING MODULES

(71) Applicant: Siemens Industry, Inc., Alpharetta, GA (US)

(72) Inventors: Fan Zhang, Suwanee, GA (US); Arthur Kevin Shumate, Duluth, GA (US); Brian J. Rusch, Suwanee, GA (US); Carey D. Harnois, Grayson, GA (US); Gustavo Cortes Rico, Suwanee, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 483 days.

(21) Appl. No.: 15/689,277

(22) Filed: Aug. 29, 2017

(65) Prior Publication Data
US 2018/0364281 A1 Dec. 20, 2018

Related U.S. Application Data

(60) Provisional application No. 62/521,742, filed on Jun. 19, 2017.

(51) Int. Cl.
*H02G 5/00* (2006.01)
*G01R 11/04* (2006.01)
(Continued)

(52) U.S. Cl.
CPC .............. *G01R 11/04* (2013.01); *H02B 1/03* (2013.01); *H02B 1/207* (2013.01); *H02B 1/32* (2013.01);
(Continued)

(58) Field of Classification Search
CPC . H02B 1/03; H02B 1/207; H02B 1/32; H02B 1/01; H02B 1/011; H02B 1/052;
(Continued)

(56) References Cited

U.S. PATENT DOCUMENTS

| 4,079,439 A * | 3/1978 | Coles | H02B 1/056 |
| | | | 174/70 B |
| 5,982,611 A * | 11/1999 | Campbell | H02B 1/21 |
| | | | 174/541 |

(Continued)

*Primary Examiner* — Angel R Estrada (57) ABSTRACT

A main feed thru unit configured as a service equipment or a main service disconnect is provided for distributing power in modular metering mains. The main feed thru unit comprises an enclosure having a back side, a first side, a second side, a top side and a bottom side and a bus assembly. The bus assembly includes a feed thru bus assembly including a plurality of feed thru bus bars configured to receive line power at feed line terminals and pass thru power to feed thru terminals, a cross bus assembly including a plurality of cross bus bars extending between the first side and the second side and a main breaker coupled between the feed line terminals and the plurality of cross bus bars to feed power thru and output power via the plurality of cross bus bars. The enclosure is configured to allow electrical connection to the plurality of cross bus bars through an opening in at least one of the first side and the second side.

15 Claims, 9 Drawing Sheets

(51) Int. Cl.
*H02B 1/32* (2006.01)
*H02B 1/03* (2006.01)
*H02B 1/20* (2006.01)
*G01R 21/00* (2006.01)

(52) U.S. Cl.
CPC ......... *G01R 21/00* (2013.01); *H04M 2215/00* (2013.01); *H04Q 2209/60* (2013.01)

(58) Field of Classification Search
CPC . H02B 1/00; H04M 2215/00; H04Q 2209/60; G01R 11/04; G01R 11/02; G01R 11/00; H02G 5/06; H02G 5/00; H02G 5/002; H02G 5/025
USPC ........... 174/50, 520, 72 B, 71 B, 68.2, 88 B, 174/99 B; 361/600, 601, 611, 624, 637, 361/648, 679.01, 775
See application file for complete search history.

(56) References Cited

U.S. PATENT DOCUMENTS

| | | | | |
|---|---|---|---|---|
| 6,934,147 | B2* | 8/2005 | Miller | H02B 1/21 |
| | | | | 174/68.2 |
| 7,329,813 | B2* | 2/2008 | Josten | H02B 1/14 |
| | | | | 174/68.2 |
| 7,718,889 | B2* | 5/2010 | Rasmussen | G06F 1/189 |
| | | | | 174/50 |
| 8,619,411 | B2* | 12/2013 | Rodrigues | H02B 1/21 |
| | | | | 361/611 |
| 8,730,061 | B2 | 5/2014 | Wang et al. | |
| 8,913,354 | B2* | 12/2014 | Van Fossen | B60L 53/30 |
| | | | | 361/42 |
| 8,952,252 | B2* | 2/2015 | Bugaris | H02B 13/025 |
| | | | | 174/50 |
| 9,007,746 | B2* | 4/2015 | Rajvanshi | H02B 1/565 |
| | | | | 174/50 |
| 2017/0054276 | A1 | 2/2017 | Zhang et al. | |

* cited by examiner

MAIN FEED THRU UNIT CONFIGURED AS A SERVICE EQUIPMENT OR A MAIN SERVICE DISCONNECT FOR MODULAR METERING MODULES

CROSS REFERENCE TO RELATED APPLICATIONS

This application claims the benefit of U.S. Provisional Application Ser. No. 62/521,742 entitled "POWER MODULE MAIN FEED THRU," filed on Jun. 19, 2017, the contents of which are hereby incorporated by reference herein in their entirety.

BACKGROUND

1. Field

Aspects of the present invention generally relate to combining a feed thru tap box with a main disconnect unit and eliminate the necessity of wiring from the main disconnect unit to the feed thru tap box and more specifically relate to configuring a main feed thru unit as a service equipment or a main service disconnect for distributing power to modular metering modules.

2. Description of the Related Art

A modular metering arrangement is frequently used to supply electrical power to buildings having multiple units such as a multi-family dwelling. A conventional modular metering arrangement includes a main circuit breaker located in a main box positioned between first and second banks of meter modules that include one or more stacks of meter sockets. Modules may be added to or removed from the first and second banks of modules as needed to accommodate a particular building. A cross bus located in the main box provides current to each module. Each meter socket is electrically connected to a building unit and is adapted to receive a metering device used to determine how much electricity has been consumed in the associated building unit, for example. A circuit breaker is associated with each meter socket. Electrical power to individual building units may be connected or disconnected by closing or opening an associated circuit breaker by actuating an associated breaker handle.

Existing power distribution systems for multi-unit buildings generally include one or more stacks of meter sockets configured to receive utility meters, a main service breaker panel adapted to contain a main service circuit breaker, and a primary feed through tap box configured to pass power to other floors or areas of the building. Another floor or area of the multi-unit building may then include another feed through tap box receiving power from the primary feed through tap box, another main breaker panel, and one or more additional stacks of utility meters.

However, existing power distribution systems have difficulty in fitting within certain space constraints, thus there is a need for improvements to power distribution systems for multi-unit buildings.

When a main disconnect unit is in the same electrical room where the power mod feed thru tap boxes are located, it is difficult to install and connect a top exit main disconnect unit to an underground feed thru tap box, especially in limited sized electrical rooms. However, it is generally desired to reduce installation time and reduce the number of electrical gears, thus minimizing the wall space and cost required for the electrical equipment.

Currently, customers have to use a stand alone main disconnect unit and a wire to a feed thru tap box or a feed thru main, or thru a main breaker unit to a tap box to output both on a cross bus and feed thru terminals. However, this type of configuration does not allow value to be engineered into the design of electrical rooms because we neither fit all the electrical equipment into a smaller footprint nor save installation time and wire.

A customer could use a busway instead of a cable to distribute power vertically through a building. However, depending on the specifics of the building, including the building height, the busway is not always an economical solution.

Therefore, there is a need for effectively distributing power to modular metering mains via a main feed thru unit while overcoming various problems and shortcomings of the prior art.

SUMMARY

Briefly described, aspects of the present invention relate to combining a main disconnect unit and a feed through tap box to reduce installation time and reduce the number of electrical gears, thus minimizing the wall space and cost required for the electrical equipment. A main feed thru unit is configured as a service equipment or a main service disconnect for distributing power to modular metering modules.

In accordance with one illustrative embodiment of the present invention, a main feed thru unit is configured as a service equipment or a main service disconnect. The main feed thru unit comprises an enclosure having a back side, a first side, a second side, a top side and a bottom side and a bus assembly. The bus assembly includes a feed thru bus assembly including a plurality of feed thru bus bars configured to receive line power at feed line terminals and pass thru power to feed thru terminals, a cross bus assembly including a plurality of cross bus bars extending between the first side and the second side and a main breaker coupled between the feed line terminals and the plurality of cross bus bars to feed power thru and output power via the plurality of cross bus bars. The enclosure is configured to allow electrical connection to the plurality of cross bus bars through an opening in at least one of the first side and the second side.

In accordance with another illustrative embodiment of the present invention, a modular metering modules comprising a main feed thru unit and a transformer. The main feed thru unit is connected to the transformer directly as a main service disconnect. The modular metering mains further comprises one or more first modules horizontally connected to the main feed thru unit via a cross bus. The modular metering modules further comprises a feed thru main unit vertically connected to the main feed thru unit on a next floor or at another electrical room. The main feed thru unit is configured to distribute electrical power to the one or more first modules through the cross bus and to the feed thru main unit.

Still other aspects, features, and advantages of the present invention may be readily apparent from the following description by illustrating a number of example embodiments and implementations. The present invention may also be capable of other and different embodiments, and its details may be modified in various respects, all without departing from the substance and scope of the present

DETAILED DESCRIPTION

To facilitate an understanding of embodiments, principles, and features of the present invention, they are explained hereinafter with reference to implementation in illustrative embodiments. In particular, they are described in the context of a main feed thru unit configured as a service equipment or a main service disconnect for distributing power to modular metering modules. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

When a mid rise or a high rise building is designed to use wire to distribute electrical power throughout the building instead of busway, it is desired to have a main feed thru module as a service equipment or a main disconnect that has a main breaker that is able to feed thru and to output via a cross bus. Currently, this kind of electrical gear does not exist. The common solutions are to set a standalone main disconnect unit and connect to a feed thru main or a feed thru tap box to modular metering. These solutions sometimes run into difficulties when the main disconnect unit and the modular metering are in a limited sized electrical room. The standalone main disconnect unit takes additional wall space and it also needs wiring space to exit wire from the main disconnect unit to a feed thru main or a feed thru tap box, especially to route the top exit wire to an underground feed thru main or a feed thru tap box.

In one embodiment, a main feed thru unit is now configured as a service equipment or a main service disconnect for distributing power to modular metering mains. By combining a main disconnect unit and a feed through tap box the new solution reduces installation time and reduces the number of electrical gears, thus minimizing the wall space and cost required for the electrical equipment.

Embodiments of the present invention have many advantages. There is a reduction in the number of pieces of equipment required for an electrical installation as well as the reduced wall space consumed by the electrical equipment. The design of the bus in the enclosure allows for the main breaker to be included in approximately the same width as the feed through tap box. This invention allows one to engineer value into the design of electrical rooms as one can fit the required electrical equipment into a smaller footprint thus save installation time and wire.

These and other embodiments of a main feed thru unit are described below with reference to FIGS. 1-9. The drawings are not necessarily drawn to scale. Like reference numerals are used throughout to denote like elements.

Figure 1:
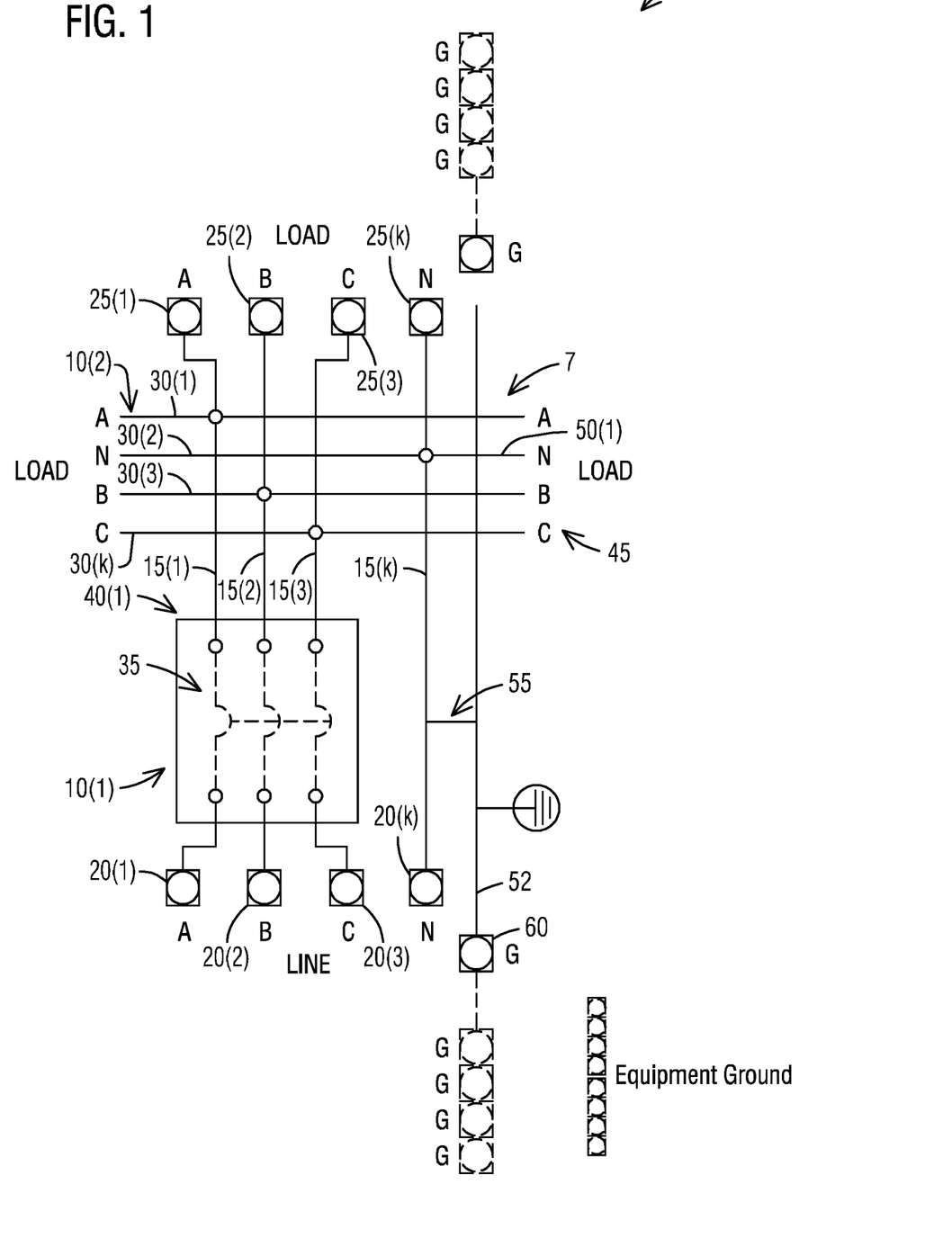
FIG. 1 illustrates a schematic diagram of a main feed thru unit in accordance with an exemplary embodiment of the present invention.

Consistent with one embodiment of the present invention, FIG. 1 represents a schematic diagram of a main feed thru unit 5 in accordance with an exemplary embodiment of the present invention. The main feed thru unit 5 is configured as a service equipment or a main service disconnect. The main feed thru unit 5 comprises an enclosure (see FIGS. 4-9) having a back side, a first side, a second side, a top side and a bottom side. The main feed thru unit 5 further comprises a bus assembly 7 in the enclosure. The bus assembly 7 includes a feed thru bus assembly 10(1) including a plurality of feed thru bus bars 15(1-$k$) configured to receive line power at feed line terminals 20(1-$k$) and pass thru power to feed thru terminals 25(1-$k$). The bus assembly 7 further includes a cross bus assembly 10(2) including a plurality of cross bus bars 30(1-$k$) extending between the first side and the second side. The enclosure is configured to allow electrical connection to the plurality of cross bus bars 30(1-$k$) through an opening in at least one of the first side and the second side. The bus assembly 7 further includes a main breaker 35 coupled between the feed line terminals 20(1-$k$) and the plurality of cross bus bars 30(1-$k$) to feed power thru and output power via the plurality of cross bus bars 30(1-$k$). The main feed thru unit 5 may be configured to be connected directly to a transformer like as the main service disconnect.

In the main feed thru unit 5, the underground feed line terminals 20(1-$k$) are below the main breaker 35. From left to right, they are A, B, C, and N phase terminals. A load side 40(1) of the main breaker 35 connects to the feed thru terminals 25(1-$k$) on the top and a cross bus 45. The main breaker 35 protects all load phase bus and terminals leaving the enclosure. The Neutral (N) is on the right of the main breaker 35. A line neutral terminal 20($k$) is directly linked to a load feed thru neutral terminal 25($k$) and tapped to a cross bus neutral 50(1). A ground bar 52 is mounted on the back of the enclosure. A bond strap 55 connects a ground 60 to the neutral 25($k$) when the main feed thru unit 5 serves as a service equipment. When the main feed thru unit 5 is not a service equipment, the bond strap 55 will be disconnected. The ground bar 52 can be extended using accessory kits, which accept multiple electrical equipment ground connections.

As used herein, "main feed thru unit" refers to a power distribution equipment to provide power in a modular metering module. The "main feed thru unit," in addition to the exemplary hardware description above, refers to a main feed thru module as service equipment or main disconnect that has a main breaker that is able to feed thru and to output via a cross bus. The main feed thru unit combines a feed through tap box with a main disconnect unit. This saves the wall space and eliminates the necessity of wiring from the main disconnect unit to the feed through tap box.

The techniques described herein can be particularly useful for using the 3 phases as A, N, B and C bus. While particular embodiments are described in terms of the 3 phases as A, N, B and C bus, the techniques described herein are not limited to the 3 phases as A, N, B and C bus but can also use other types of power distribution configuration.

Figure 2:
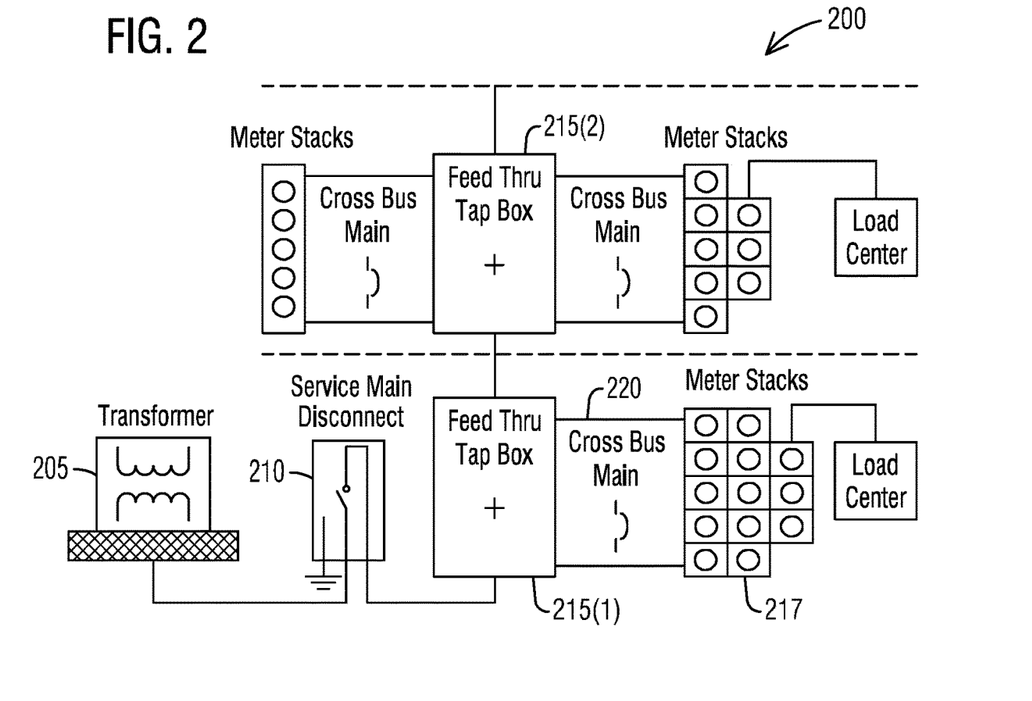
FIG. 2 illustrates a diagram showing an existing equipment solution (prior art).

Referring to FIG. 2, it illustrates a diagram showing an existing equipment 200 solution (prior art). Electrical power from a transformer 205 enters a building to a service main disconnect 210 that protects all electrical equipment of the building. Then the electrical power is delivered to a feed thru tap box 215(1) that distributes the electrical power to horizontally connected modules 217 through a cross bus 220, and vertically connected to a next floor feed thru tap box 215(2), hence further distributing the electrical power.

Figure 3:
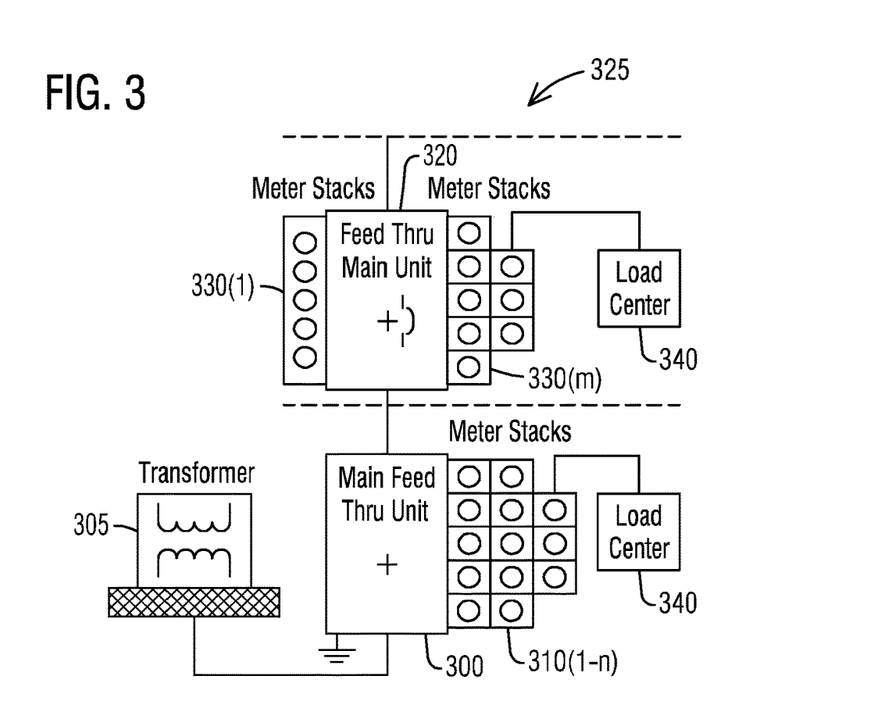
FIG. 3 illustrates an application of a main feed thru unit configured as a service equipment or a main service disconnect in accordance with an exemplary embodiment of the present invention.

Turning now to FIG. 3, it illustrates an application of a main feed thru unit 300 configured as a service equipment or a main service disconnect in accordance with an exemplary embodiment of the present invention. FIG. 3 shows an electrical riser diagram using the main feed thru unit 300. The main feed thru unit 300 can be connected to a transformer 305 directly as a main service disconnect. It is possible to couple the main feed thru unit 300 to the transformer 305 so that it can act as the service equipment to a building. The transformer 305 will be connected with a wire from the transformer 305 to the main feed thru unit 300. One of the unique aspects about this invention is that it can act as the service equipment point. While the word "coupled" is used to describe the connection from the transformer 305 to the main feed thru unit 300 it does not imply that the transformer 305 is included in the same enclosure as the main feed thru unit 300 or may be that the enclosures are joined somehow. The transformer 305 and the main feed thru unit 300 are not joined together in any way other than an electrical cable that will carry power from the transformer 305 to the main feed thru unit 300.

The main feed thru unit 300 can distribute electrical power to horizontally connected first modules 310(1-n) through a cross bus (not seen), and to a vertically connected feed thru main unit 320 on the next floor or at another electrical room. The feed thru main unit 320 can further distribute electrical power. The configuration of using the main feed thru unit 300 and the feed thru main unit 320 eliminates (4) pieces of equipment, one service main disconnect, and three cross bus mains, compared to a solution shown in FIG. 2. Therefore, the main feed thru unit 300 can significantly save the number of pieces of electrical equipment, save installation time, save conductors connecting between enclosures and reduce the amount of wall space consumed.

FIG. 3 shows an example of a modular metering modules 325 comprising the main feed thru unit 300 and the transformer 305. One or more first modules 310(1-n) are horizontally connected to the main feed thru unit 300 via the cross bus. The feed thru main unit 320 is vertically connected to the main feed thru unit 300 such that the main feed thru unit 300 to distribute electrical power to the one or more first modules 310(1-n) through the cross bus, and to the feed thru main unit 320. The one or more first modules 310(1-n) include first meter stacks. One or more second modules 330(1-m) are horizontally connected to the feed thru main unit 320 via a cross bus (not seen). The one or more second modules 330(1-m) include second meter stacks. The first meter stacks and the second meter stacks are connected to a load center 340. Note that the first meter stacks and the second meter stacks are not physically joined to the load center 340. There is a cable connecting the meter stacks in an electrical room to the load center 340 in each apartment.

Figure 4:
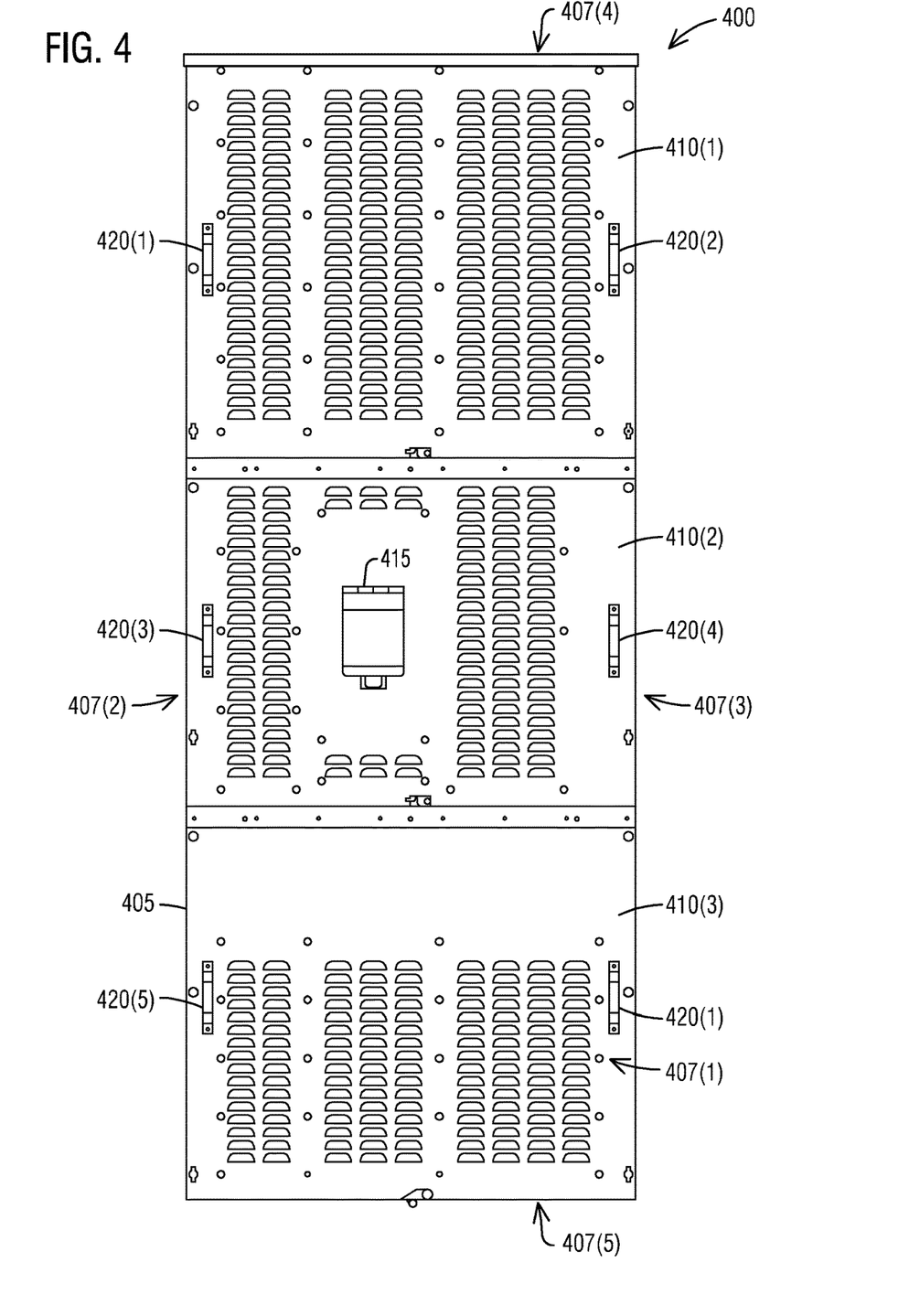
FIG. 4 illustrates a front view of a main feed thru unit in accordance with an exemplary embodiment of the present invention.

FIG. 4 illustrates a front view of a main feed thru unit 400 in accordance with an exemplary embodiment of the present invention. The main feed thru unit 400 is configured as a service equipment or a main service disconnect. The main feed thru unit 400 comprises an enclosure 405 having a back side (not seen), a front side 407(1), a first side 407(2), a second side 407(3), a top side 407(4) and a bottom side 407(5). The main feed thru unit 400 has three covers, top terminal cover, center breaker cover and bottom terminal cover. For example, the main feed thru unit 400 comprises a bus assembly (not seen) in the enclosure 405. The main feed thru unit 400 further comprises a top cover 410(1), a middle cover 410(2), and a bottom cover 410(3). The main feed thru unit 400 further comprises a plastic beaker cover 415 and a plurality of handles 420(1-6). The top cover 410(1), the middle cover 410(2), and the bottom cover 410(3) have louvers to act as heat vents. There are multiple columns of louvers on each cover 410. Two handles 420(1-6) for each cover 410. Each cover 410 can be independently removed without disturbing other covers 410. The plastic breaker cover 415 on the center breaker cover 410(2) can be opened to access a main breaker handle to turn the breaker on, off or reset. All the covers 410 can be locked individually.

Figure 5:
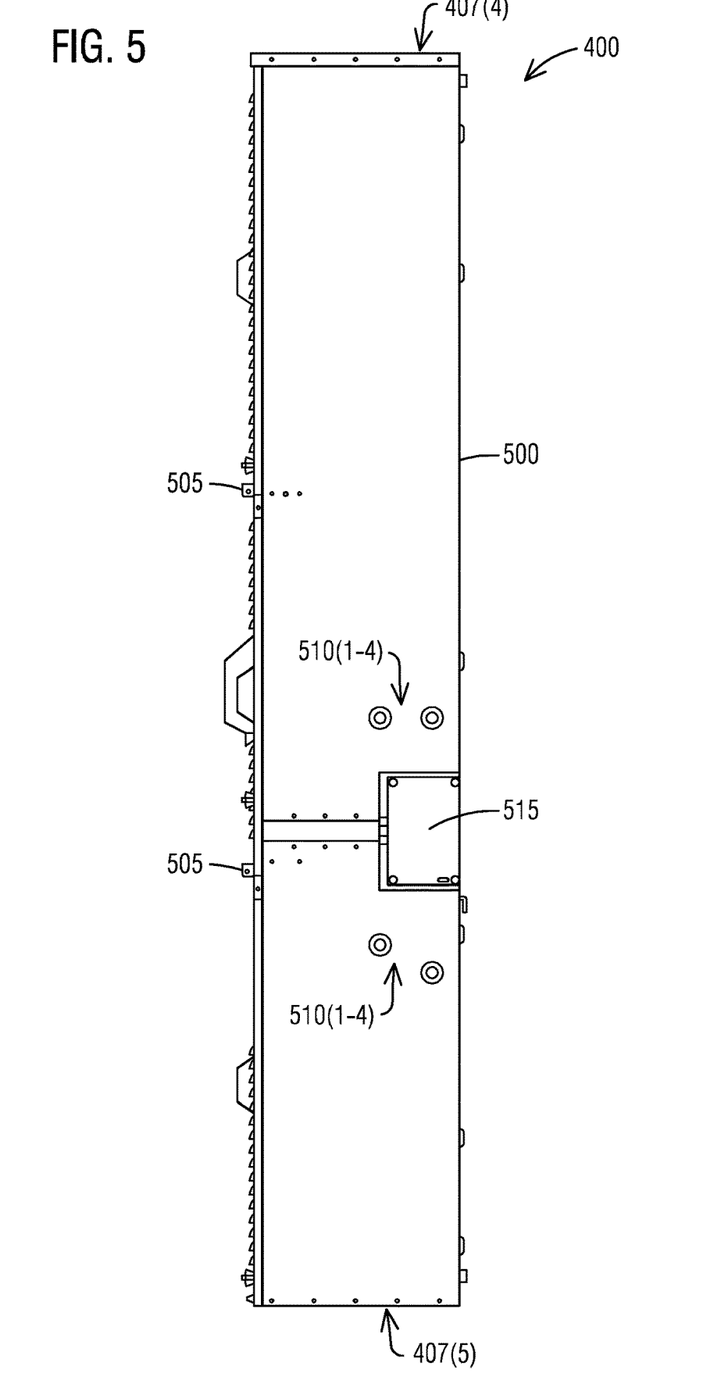
FIG. 5 illustrates a right side view of the main feed thru unit of FIG. 4 in accordance with an exemplary embodiment of the present invention.

As seen in FIG. 5, it illustrates a right side view of the main feed thru unit 400 of FIG. 4 in accordance with an exemplary embodiment of the present invention. The main feed thru unit 400 comprises the enclosure 405 having a back side 500. The main feed thru unit 400 comprises a quick roll bracket 505, four embosses 510(1-4) and a rectangular cross bus cover 515. A cross bus is hidden behind the cross bus cover 515. The rectangular cross bus cover 515 between 4 embosses 510(1-4) encloses the cross bus that distributes electrical power thru all modular metering modules. A channel in front of the rectangular cross bus cover 515 provides access for wrenches to tighten a quick connect nut to electrically join the modular metering modules. The 4 embosses 510(1-4) are to mate with similar embosses of adjacent enclosure to align and space the modular metering modules. On the back of the enclosure 405 and above the rectangular cross bus cover 515, a series of the quick roll brackets 505 are to mount and align the main feed thru unit 400 with other metering modules.

Figure 6:
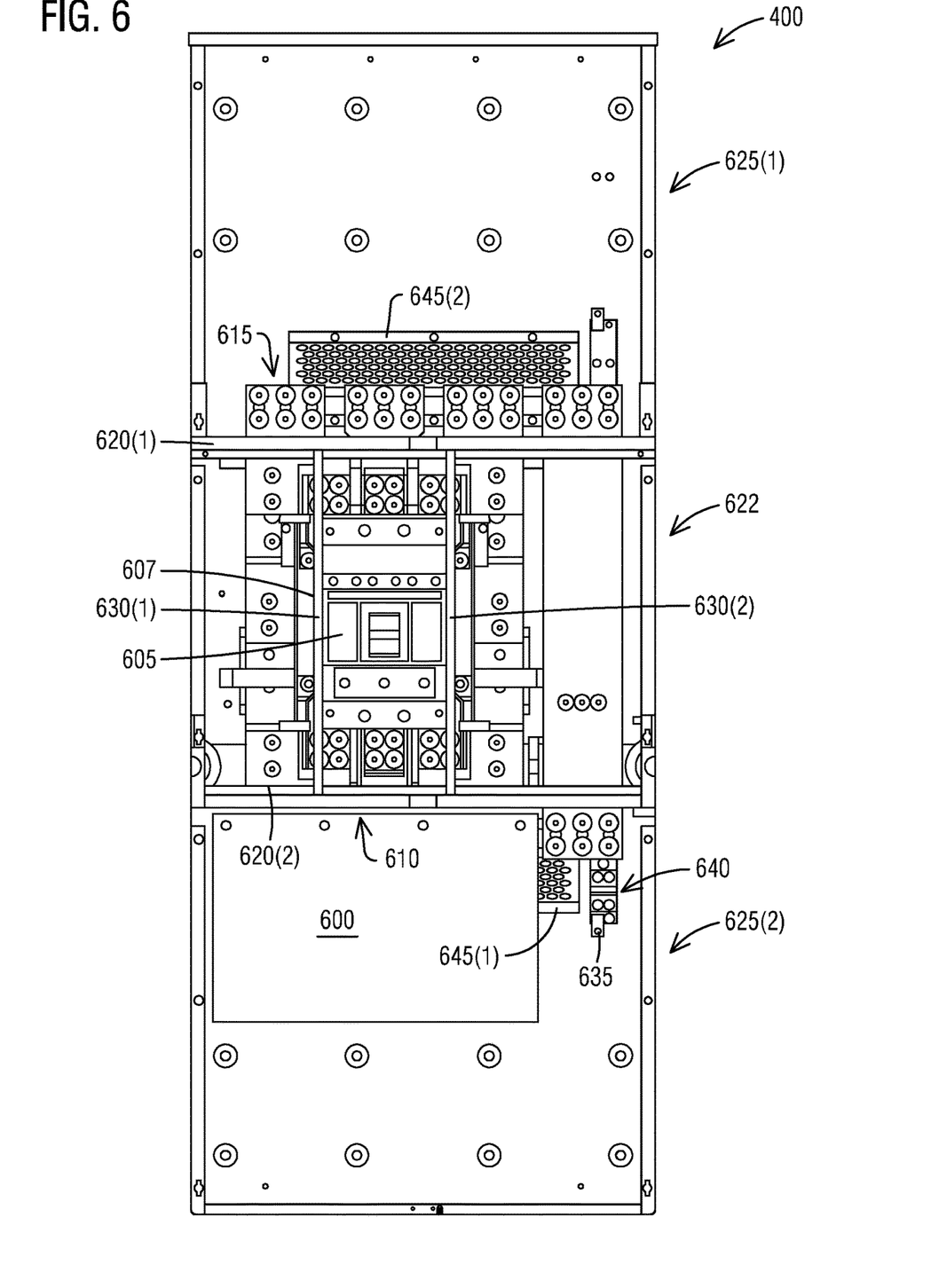
FIG. 6 illustrates the interior of the main feed thru unit with the covers removed in accordance with an exemplary embodiment of the present invention.

As shown in FIG. 6, it illustrates the interior of the main feed thru unit 400 with the covers 410 removed in accordance with an exemplary embodiment of the present invention. The main feed thru unit 400 includes a shield (line terminal barrier) 600. A main breaker 605 is mounted on a breaker frame block 607 over A, B and C phase bus such that feed line terminals 610 are connected to a bottom of the main breaker 605 and feed thru terminals 615 are connected to a top of the main breaker 605. The feed thru terminals 615 and the feed line terminals 610 are supported on perforated metal brackets 645(1-2).

The main feed thru unit 400 further comprises first and second horizontal barriers 620(1-2) that separate a breaker compartment 622 from a top terminal compartment 625(1) and a bottom terminal compartment 625(2). The main feed thru unit 400 further comprises first and second vertical brackets 630(1-2) linking the first and second horizontal barriers 620(1-2) on the sides of the main breaker 605 such that a neutral (N) is disposed on a right side of the main breaker 605 and a ground bar 635 is laid on back with a link jumper 640 connecting to the neutral (N) in order to use the main feed thru unit 400 as the service equipment.

In one embodiment, the main feed thru unit 400 may be a 3 phase unit rated 240 vac 1200 A to 2000 A with short circuit interrupting rating up to 100 kA rms. From left to right, the terminals are laid as A, B, C and N shown on the top. The bottom line terminals, laid out in similar fashion as top terminals, are shielded by insulated barriers to prevent unintentional contact to live parts when the main breaker 605 is in OFF position. The main breaker 605 is mounted on the breaker frame block 607 over the A, B and C phase bus. The bottom line terminals (underground feed) are connected to the bottom of the main breaker 605 and the top terminals are connected to the top of the main breaker 605. The two horizontal barriers 620(1-2) separate the breaker compartment to the top and bottom terminal compartments. There are two vertical brackets 630(1-2) linking the two horizontal barriers 620(1-2) on the sides of the main breaker 605. The neutral (N) is on right side the main breaker 605. The ground bar 635 is laid on back with the link jumper 640 connecting to the neutral (N). The link jumper 640 can be removed when the main feed thru unit 400 is not used as a service equipment. Each terminal has 6 studs for mounting up to (3) NEMA 2 mechanical lugs, installing up to 6 conductors per phase.

Figure 7:
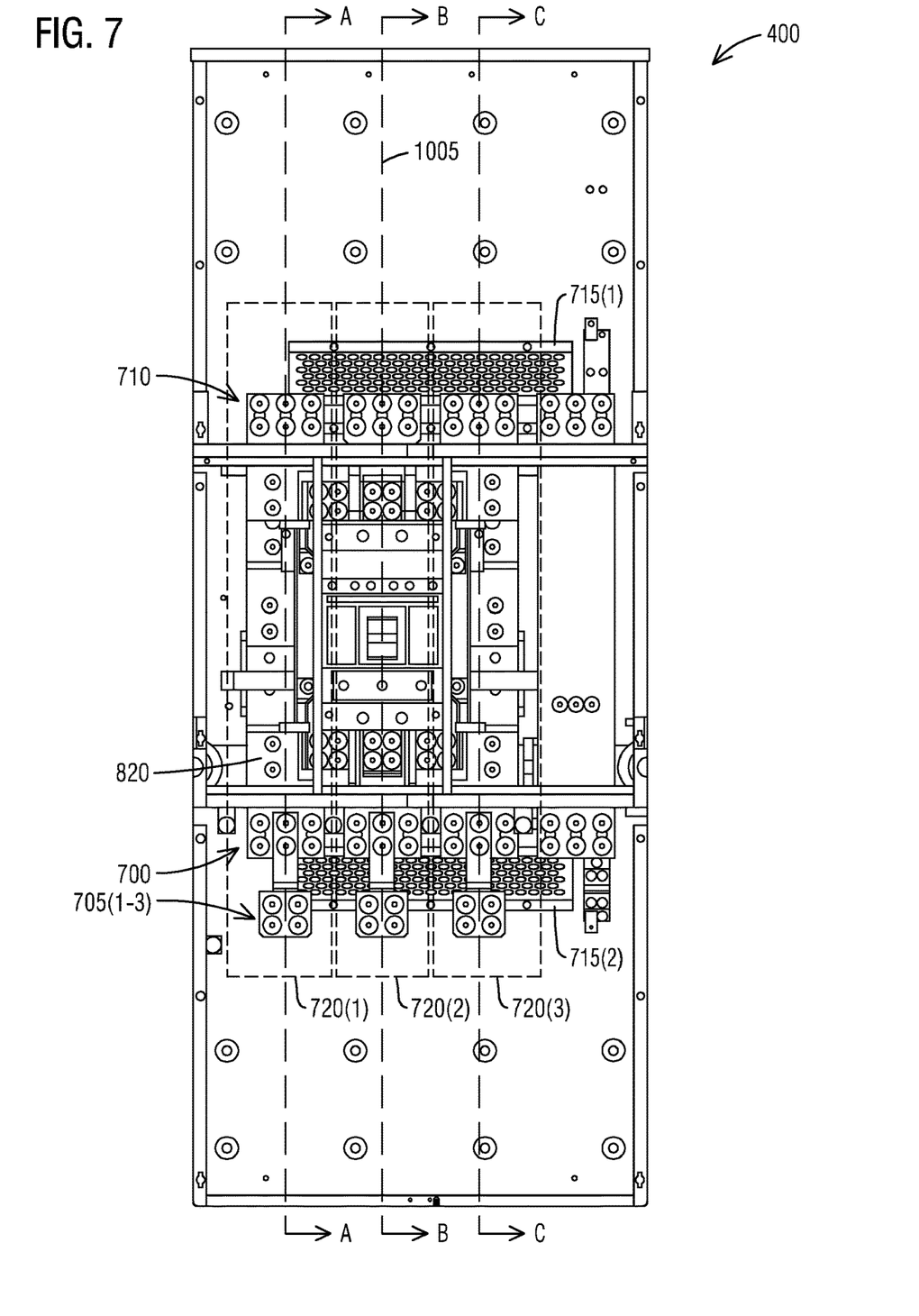
FIG. 7 illustrates as FIG. 6 except a line terminal barrier has been removed according to an exemplary embodiment of the present invention.

In FIG. 7, it illustrates as FIG. 6 except the line terminal barrier 600 has been removed according to an exemplary embodiment of the present invention. A plurality of bottom line terminals 700 have optional bus extensions 705(1-3) installed, which allow the terminals 700 to accept up to 8 conductors per phase. The top thru terminals 710 and the bottom line terminals 700 are supported on perforated metal brackets 715(1-2).

Figure 8:
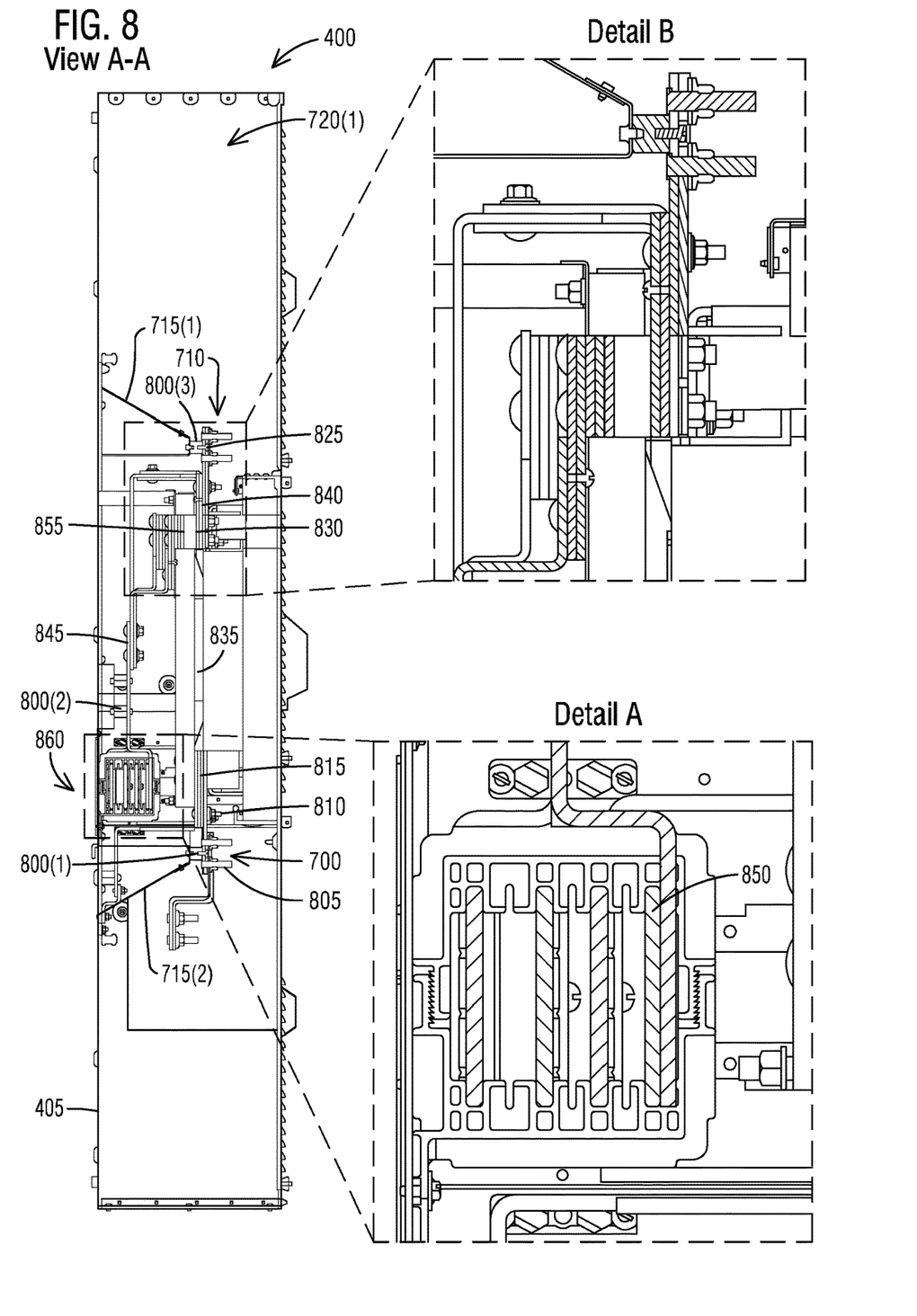
FIG. 8 illustrates a cross sectional view of A phase bus connections according to an exemplary embodiment of the present invention.

FIG. 7 illustrates a view of A phase bus connections 720(1), B phase bus connections 720(2) and C phase bus connections 720(3). FIG. 8 illustrates a cross sectional view of the A phase bus connections 720(1) according to an exemplary embodiment of the present invention.

FIG. 8 illustrates a cross sectional view of A phase bus connections 720(1) according to an exemplary embodiment of the present invention. Referring to both FIG. 7 and FIG. 8, in the main feed thru unit 400 the A phase bus connections 720(1) include the bottom line terminals 700 (feed line terminals) that are seated on standoffs 800(1) supported by the perforated metal bracket 715(2) such that an A phase bottom line terminal 805 is connected to a main breaker bottom terminal 810 via a line connection bus 815 that extends the A phase main breaker terminal 805 to a left terminal bus 820 (see FIG. 7).

On a top (load) side of the main breaker 605, an A phase feed thru terminal 825 is connected to a front surface of A phase 830 in a breaker frame block 835 through a load connection bus 840. A riser bus 845 from an A phase of cross bus 850 is connected to a back surface of A phase 855 in the breaker frame block 835. The standoffs 800(2) are mounted on a metal bracket supporting a middle of the riser bus 845 and the top thru terminals 710 (feed thru terminals) are mounted on the standoffs 800(3) supported by the metal bracket 715(1). A cross bus 860 is disposed on the back side of the enclosure 405 as a power distribution bus that crosses all modular metering modules. The cross bus 860 has spaced bus bars for 3 phases as A, N, B and C bus.

Figure 9:
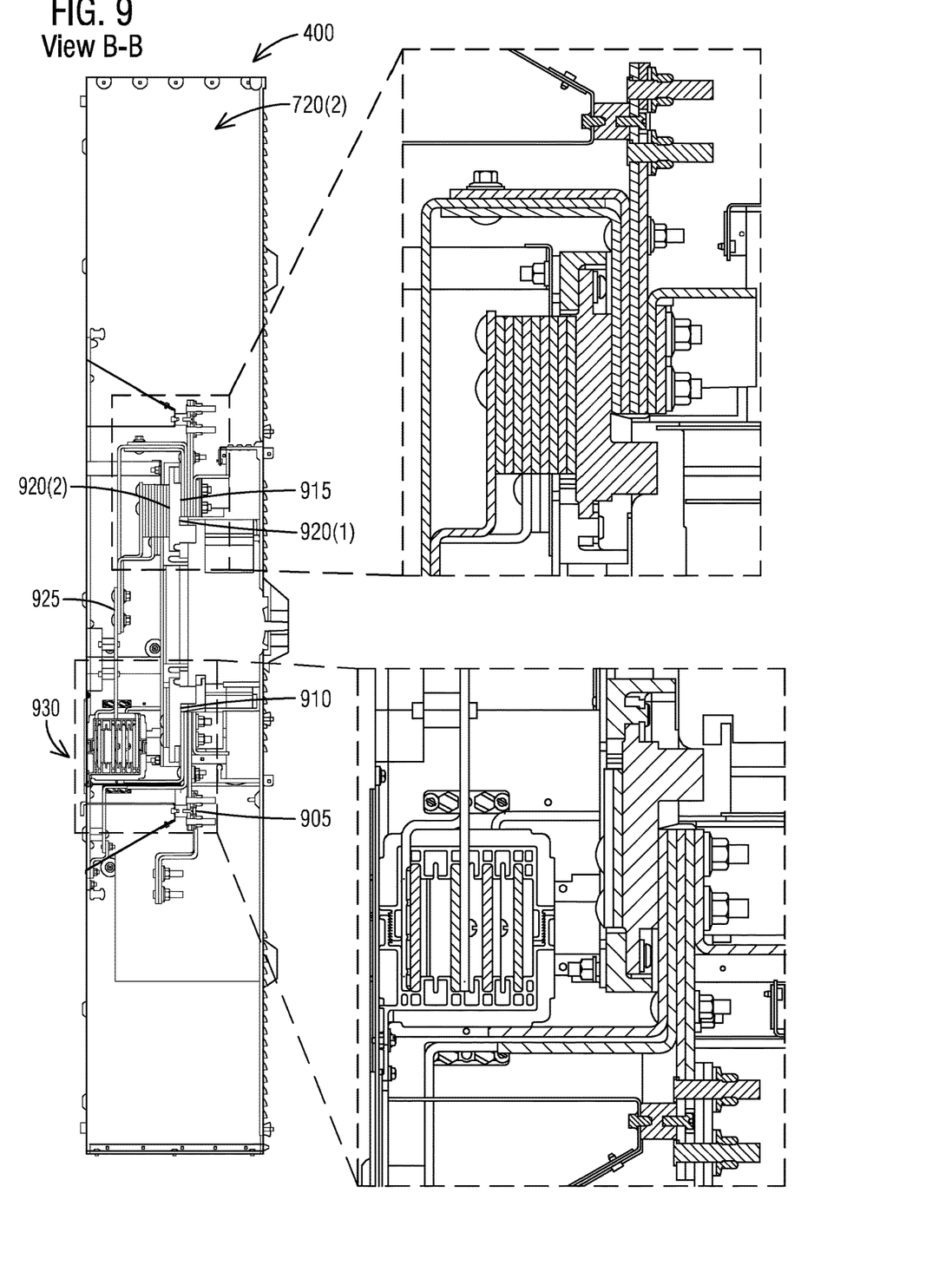
FIG. 9 illustrates a cross sectional view of B phase bus connections according to an exemplary embodiment of the present invention.

FIG. 9 illustrates a cross sectional view of the B phase bus connections 720(2) according to an exemplary embodiment of the present invention. In the main feed thru unit 400, the B phase bus connections 720(2) include a B phase bottom (line) terminal 905 connected to a bottom front surface of B phase 910 in the breaker frame block 607. A B phase top (load) terminal 915 is connected to a front surface in the B phase 920(1) on the breaker frame block 607. A B phase riser bus 925 connects from a B phase cross bus 930 to a front and a back surface of the B phase 920(1), 920(2) in the breaker frame block 607.

Figure 10:
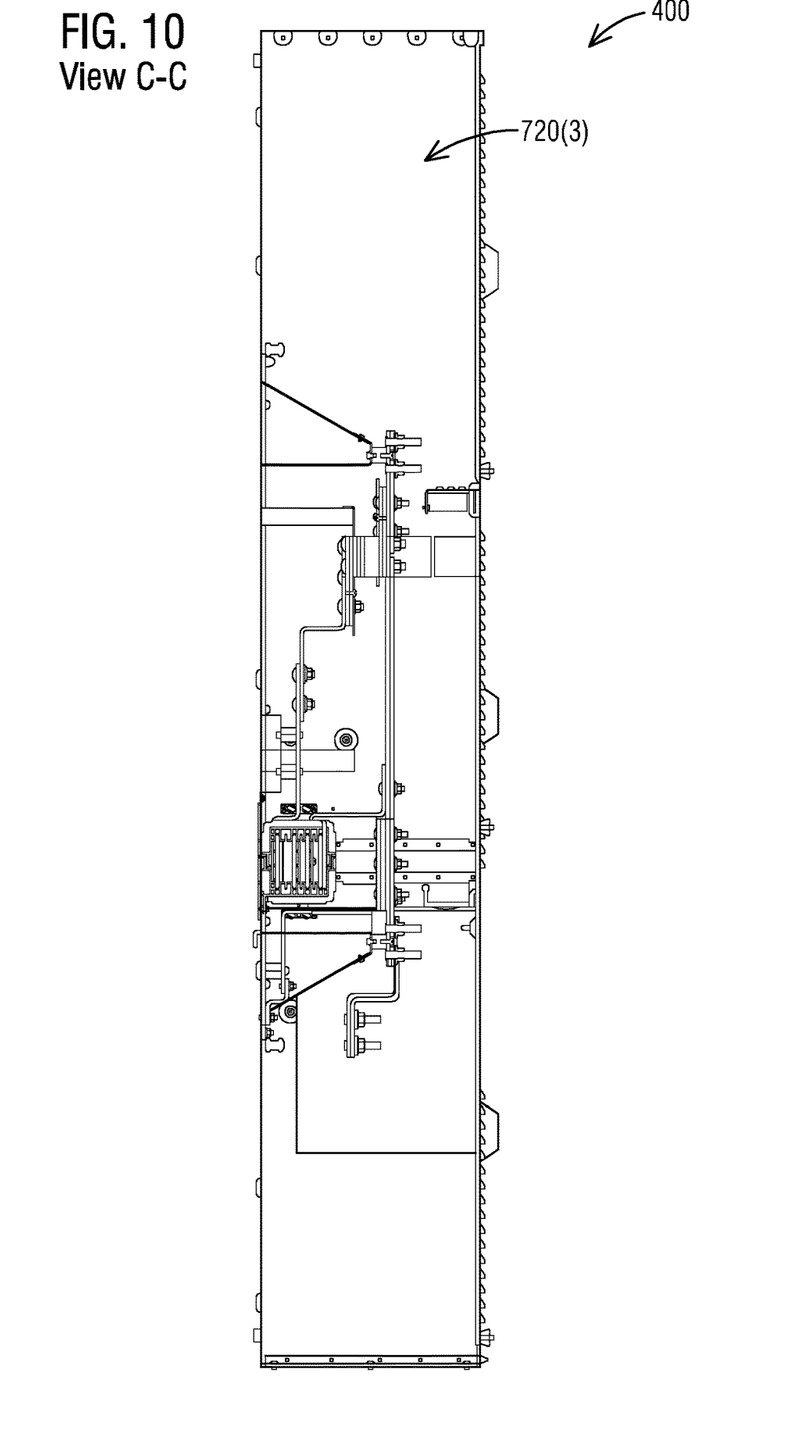
FIG. 10 illustrates a cross sectional view of C phase bus connections according to an exemplary embodiment of the present invention.

FIG. 10 illustrates a cross sectional view of C phase bus connections 720(3) according to an exemplary embodiment of the present invention. In the main feed thru unit 400, the C phase bus connections 720(3) include a C phase bus being symmetrical to an A phase bus along a vertical center datum 1005 (see FIG. 7) of the main breaker 605.

One of the advantages is a reduction in the number of pieces of equipment required for an electrical installation as well as the reduced wall space consumed by the electrical equipment. The design of the bus in the enclosure 405 allows for the main breaker 605 to be included in approximately the same width as a typical feed through tap box. The main feed thru unit 400 allows one value engineer these advantages into the design of electrical rooms as one can fit electrical equipment into a smaller footprint and save installation time and wire.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A main feed thru unit configured as a service equipment or a main service disconnect, the main feed thru unit comprising:
   an enclosure having a back side, a first side, a second side, a top side and a bottom side; and
   a bus assembly in the enclosure, the bus assembly including:
   a feed thru bus assembly including a plurality of feed thru bus bars configured to receive line power at feed line terminals and pass thru power to feed thru terminals,
   a cross bus assembly including a plurality of cross bus bars extending between the first side and the second side, the enclosure configured to allow electrical connection to the plurality of cross bus bars through an opening in at least one of the first side and the second side, and
   a main breaker coupled between the feed line terminals and the plurality of cross bus bars to feed power thru and output power via the plurality of cross bus bars.

2. The main feed thru unit of claim 1, wherein the main feed thru unit is configured to be connected directly to a transformer like as the main service disconnect.

3. The main feed thru unit of claim 1, wherein the main breaker is mounted on a breaker frame block over A, B and C phase bus such that feed line terminals are connected to a bottom of the main breaker and the feed thru terminals are connected to a top of the main breaker.

4. The main feed thru unit of claim 1, further comprising:
   first and second horizontal barriers that separate a breaker compartment from a top terminal compartment and a bottom terminal compartment.

5. The main feed thru unit of claim 4, further comprising:
   first and second vertical brackets linking the first and second horizontal barriers on the sides of the main breaker such that a neutral (N) is disposed on a right side of the main breaker and a ground bar is laid on back with a link jumper connecting to the neutral (N) in order to use the main feed thru unit as the service equipment.

6. The main feed thru unit of claim 1, wherein the feed thru terminals and the feed line terminals are supported on perforated metal brackets.

7. The main feed thru unit of claim 1, wherein in A phase bus connections the feed line terminals are seated on stand-offs supported by a perforated metal bracket such that an A phase bottom line terminal is connected to a main breaker bottom terminal via a line connection bus that extends an A phase main breaker terminal to a left terminal bus.

8. The main feed thru unit of claim 7, wherein on a top (load) side of the main breaker, an A phase feed thru terminal is connected to a front surface of A phase in a breaker frame block through a load connection bus.

9. The main feed thru unit of claim 8, wherein a riser bus from an A phase of cross bus is connected to a back surface of A phase in the breaker frame block.

10. The main feed thru unit of claim 9, wherein standoffs are mounted on a metal bracket supporting a middle of the riser bus and the feed thru terminals are mounted on standoffs supported by a metal bracket.

11. The main feed thru unit of claim 1, wherein a cross bus is disposed on the back side of the enclosure as a power distribution bus that crosses all modular metering modules, the cross bus having spaced bus bars for 3 phases as A, N, B and C bus.

12. The main feed thru unit of claim 1, wherein in B phase bus connections a B phase bottom (line) terminal is connected to a bottom front surface of B phase in a breaker frame block.

13. The main feed thru unit of claim 12, wherein a B phase top (load) terminal is connected to a front surface in the B phase on the breaker frame block.

14. The main feed thru unit of claim 13, wherein a B phase riser bus connecting from a B phase cross bus to a front and a back surface of the B phase in the breaker frame block.

15. The main feed thru unit of claim 1, wherein in C phase bus connections in that a C phase bus is symmetrical to an A phase bus along a vertical center datum of the main breaker.

* * * * *